(12) United States Patent
Yue et al.

(10) Patent No.: US 9,977,297 B2
(45) Date of Patent: May 22, 2018

(54) LIQUID CRYSTAL PANEL ASSEMBLY AND LIQUID CRYSTAL PANEL PACKAGING ASSEMBLY

(71) Applicant: Shenzhen China Star Optoelectronics Technology Co., Ltd., Shenzhen, Guangdong (CN)

(72) Inventors: Liang Yue, Guangdong (CN); Gang Yu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 195 days.

(21) Appl. No.: 14/905,790

(22) PCT Filed: Aug. 21, 2015

(86) PCT No.: PCT/CN2015/087781
§ 371 (c)(1),
(2) Date: Jan. 16, 2016

(87) PCT Pub. No.: WO2017/016011
PCT Pub. Date: Feb. 2, 2017

(65) Prior Publication Data
US 2017/0168343 A1    Jun. 15, 2017

(30) Foreign Application Priority Data

Jul. 29, 2015  (CN) .......................... 2015 1 0454912

(51) Int. Cl.
*G02F 1/1345* (2006.01)
*B65D 85/48* (2006.01)

(52) U.S. Cl.
CPC ......... *G02F 1/13452* (2013.01); *B65D 85/48* (2013.01)

(58) Field of Classification Search
CPC ...... G02F 1/13452; H05K 3/361; B65D 85/48
(Continued)

(56) References Cited

U.S. PATENT DOCUMENTS

2007/0126721 A1* 6/2007 Kurokawa ............ G06F 3/1431
                                                         345/204
2009/0047806 A1* 2/2009 Azuma ............. G02F 1/133308
                                                         439/67

FOREIGN PATENT DOCUMENTS

CN         1778153 A       5/2006
CN       101322170 A      12/2008
(Continued)

*Primary Examiner* — Nathanael R Briggs
*Assistant Examiner* — William Peterson
(74) *Attorney, Agent, or Firm* — Andrew C. Cheng

(57) ABSTRACT

The liquid crystal panel packaging assembly contains a liquid crystal panel assembly and a support tray. The liquid crystal panel assembly contains a liquid crystal panel, a wiring board, and a circuit board. The wiring board has a first end electrically connected to the liquid crystal panel and a second end configured with a first connection element. The circuit board has a second connection element for connection with the first connection element so that the circuit board is electrically connected to the wiring board. The support tray contains a first indentation for receiving the liquid crystal panel, a second indentation for receiving the wiring board, and at least a socket. The second indentation is at a side and is connected to the first indentation. The socket is located at a lateral side of the second indentation, and the circuit board is plugged into the socket.

3 Claims, 4 Drawing Sheets

(58) Field of Classification Search
USPC .......................................................... 349/150
See application file for complete search history.

(56) References Cited

FOREIGN PATENT DOCUMENTS

| | | |
|---|---|---|
| CN | 102469682 A | 5/2012 |
| CN | 102923394 A | 2/2013 |
| CN | 103241469 A | 8/2013 |
| JP | 2001021859 A | 1/2001 |
| KR | 20110070547 A | 6/2011 |
| TW | I367185 B1 | 7/2012 |

* cited by examiner

US 9,977,297 B2

LIQUID CRYSTAL PANEL ASSEMBLY AND LIQUID CRYSTAL PANEL PACKAGING ASSEMBLY

CROSS REFERENCE

This application claims the priority of Chinese Patent Application No. 201510454912.0, entitled "liquid crystal panel assembly and packaging assembly thereof", filed on Jul. 29, 2015, the disclosure of which is incorporated herein by reference in its entirety.

FIELD OF THE INVENTION

The present invention relates to an electronic technology field, and more particularly to a liquid crystal panel assembly and a liquid crystal panel packaging assembly.

BACKGROUND OF THE INVENTION

Currently there are various ways of packaging liquid crystal panels. For example, there are those involving skin packing, those using injection molded boxes, and those employing blisters. There are two major types of liquid crystal panels usually referred to as cell type and open-cell type. Cell type liquid crystal panel has liquid crystal molecules sealed and sandwiched between two glass substrates whose appearance is no different from an ordinary thin glass. The open-cell type liquid crystal panel is a cell-type liquid crystal panel configured with various connectors for connecting signal sources. The open-cell type liquid crystal panel does not include components like backlight, frame, of a liquid crystal module (LCM). Usually, an open-cell type liquid crystal panel connects one or more PCB board through a flexible piece referred to as Chip on Film (COF). The COF is populated with circuits providing signal communications. The open-cell type liquid crystal panel is usually flatly placed in a support tray. The support tray positions the open-cell type liquid crystal panel from its circumference. For economical reason, usually multiple panels are stacked and placed altogether in the support tray, and the support tray provides spaces for the PCB boards and the liquid crystal panels. However, as the PCB boars are configured with electronic components of various heights and/or dimensions. When multiple PCB boards are stacked, the COFs are often damaged due to bending or warpage, thereby affecting the quality of the liquid crystal panels.

SUMMARY OF THE INVENTION

The present invention therefore provides a liquid crystal panel assembly of reduced chances of damage to the COF due to warpage.

To achieve the objective, the liquid crystal panel assembly a liquid crystal panel, a wiring board, and a circuit board. The wiring board has a first end electrically connected to a side of the liquid crystal panel and a second end configured with a first connection element. Correspondingly, the circuit board has a second connection element for connection with the first connection element so that the circuit board is electrically connected to the wiring board.

The first connection element has a plug with conductive terminals whereas the second connection element has a matched socket; or the second connection element has a plug with conductive terminals whereas the first connection element has a matched socket.

The wiring board is a flexible circuit board.

The wiring board and the first connection element are fixedly connected through adhesive dispensing.

The wiring board is fixedly connected to the liquid crystal panel through adhesive dispensing.

The first connection element has a weight within the weight bearing capacity of the wiring board.

The present invention also provides a liquid crystal panel packaging assembly containing a liquid crystal panel assembly and a support tray. The liquid crystal panel assembly contains a liquid crystal panel, a wiring board, and a circuit board. The wiring board has a first end electrically connected to a side of the liquid crystal panel and a second end configured with a first connection element. Correspondingly, the circuit board has a second connection element for connection with the first connection element so that the circuit board is electrically connected to the wiring board. The support tray contains a first indentation for receiving the liquid crystal panel, a second indentation for receiving the wiring board, and at least a socket. The second indentation is at a side and is connected to the first indentation. The socket is located at a lateral side of the second indentation, and the circuit board is plugged into the socket.

Each socket is connected to the first indentation with a gap.

The first indentation's side walls are roughened and at least a side wall of the first indentation is configured with at least a recess.

The first connection element has a plug with conductive terminals whereas the second connection element has a matched socket; or the second connection element has a plug with conductive terminals whereas the first connection element has a matched socket.

According to the present invention, the liquid crystal panel and the circuit board are connected together through plugging. As such, when the liquid crystal panels are stacked together, the wiring boards are prevented from damage due to the electronic components of various heights and/or dimensions on the circuit boards, preserving the connection integrity of the liquid crystal panels and the circuit boards.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Specifically, the terminologies in the embodiments of the present invention are merely for describing the purpose of the certain embodiment, but not to limit the invention. Examples and the appended claims be implemented in the present invention requires the use of the singular form of the book "an", "the" and "the" are intended to include most forms unless the context clearly dictates otherwise. It should also be understood that the terminology used herein that "and/or" means and includes any or all possible combinations of one or more of the associated listed items.

Figure 1:
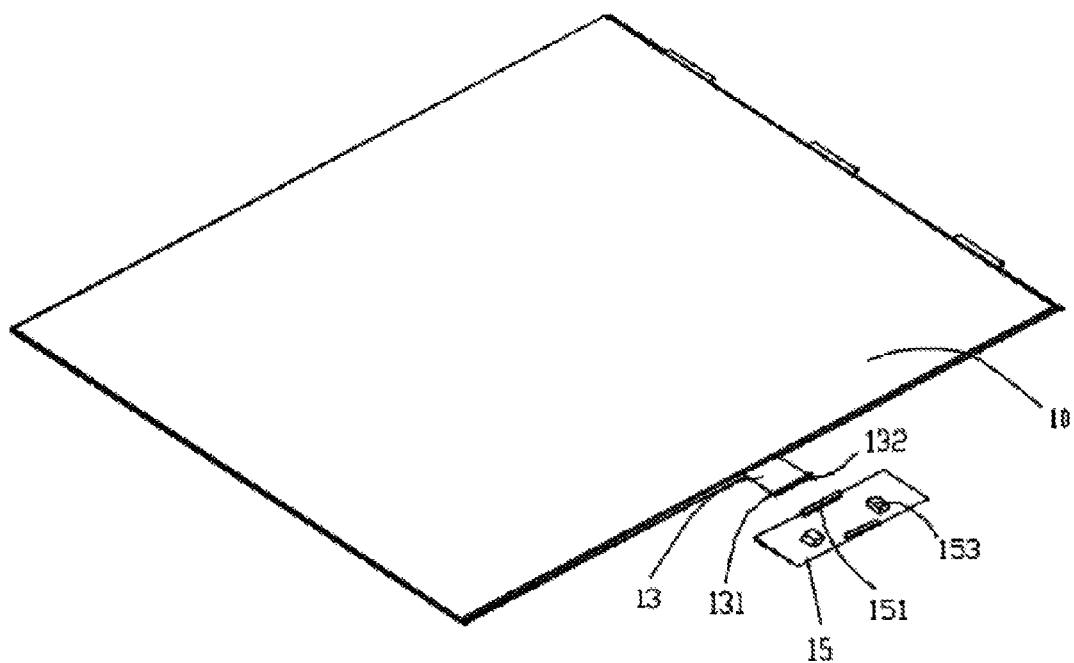
FIG. 1 is a perspective diagram showing a liquid crystal panel assembly according to an embodiment of the present invention.
Figure 2:
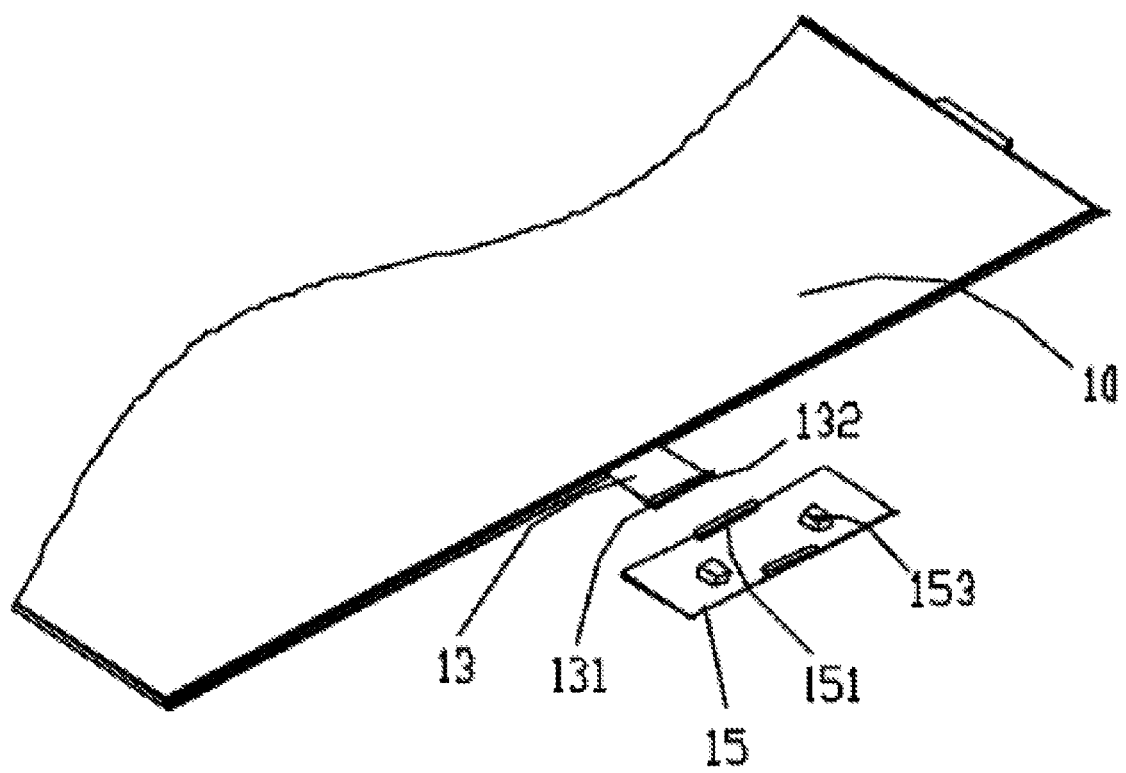
FIG. 2 is a perspective enlarged diagram showing a portion of the liquid crystal panel assembly of FIG. 1.

Please refer to FIG. 1 and FIG. 2. A liquid crystal panel assembly according to an embodiment of the present invention contains a liquid crystal panel 10, a wiring board 13, and a circuit board 15. The wiring board 13 has a first end electrically connected to a side of the liquid crystal panel 10. A second end of the wiring board 13 is configured with a first connection element 131. Correspondingly, the circuit board 15 has a second connection element 151 for connection with the first connection element 131 so that the circuit board 15 is electrically connected to the wiring board 13.

In the present embodiment, the liquid crystal panel 10 is a rectangular flat piece. The wiring board 13 is a flexible circuit board. The first end of the wiring board 13 is extended into the inside of the liquid crystal panel 10 and electrically connected with the liquid crystal panel 10's internal circuits. In the present embodiment, the wiring board 13 is fixedly connected to the liquid crystal panel 10 through adhesive dispensing.

The first connection element 131 has a plug with conductive terminals whereas the second connection element 151 has a matched socket. Alternatively, the second connection element 151 has a plug with conductive terminals whereas the first connection element 131 has a matched socket. In the present embodiment, the first connection element 131 has a plug 132 with conductive terminals configured outside the plug 132 whereas the second connection element 151 has a matched socket.

The wiring board 13 and the first connection element 131 are fixedly connected through adhesive dispensing. The first connection element 131 has a weight within the weight bearing capacity of the wiring board 13. Specifically, the liquid crystal panel 10 and the wiring board 13 are co-planar and, when the wiring board 13 is not supported by some supporting mechanism, the wiring board 13 is rigid enough to sustain a pull from the weight of the first connection element 131 and is not deformed by the gravity on first connection element 131. The first connection element 131 is dimensionally smaller than the circuit board 15, and is made of a material of a lighter weight.

The circuit board 15 is a rectangular flat piece. On a major side of the circuit board 15, there are a number of electronic components 153 of various heights and/or dimensions.

The liquid crystal panel 10 and the circuit board 15 are connected together through plugging. As such, when the liquid crystal panels 10 are stacked together, the wiring boards 13 are prevented from damage due to the electronic components of various heights and/or dimensions on the circuit boards 15, preserving the connection integrity of the liquid crystal panels 10 and the circuit boards 15.

Figure 3:
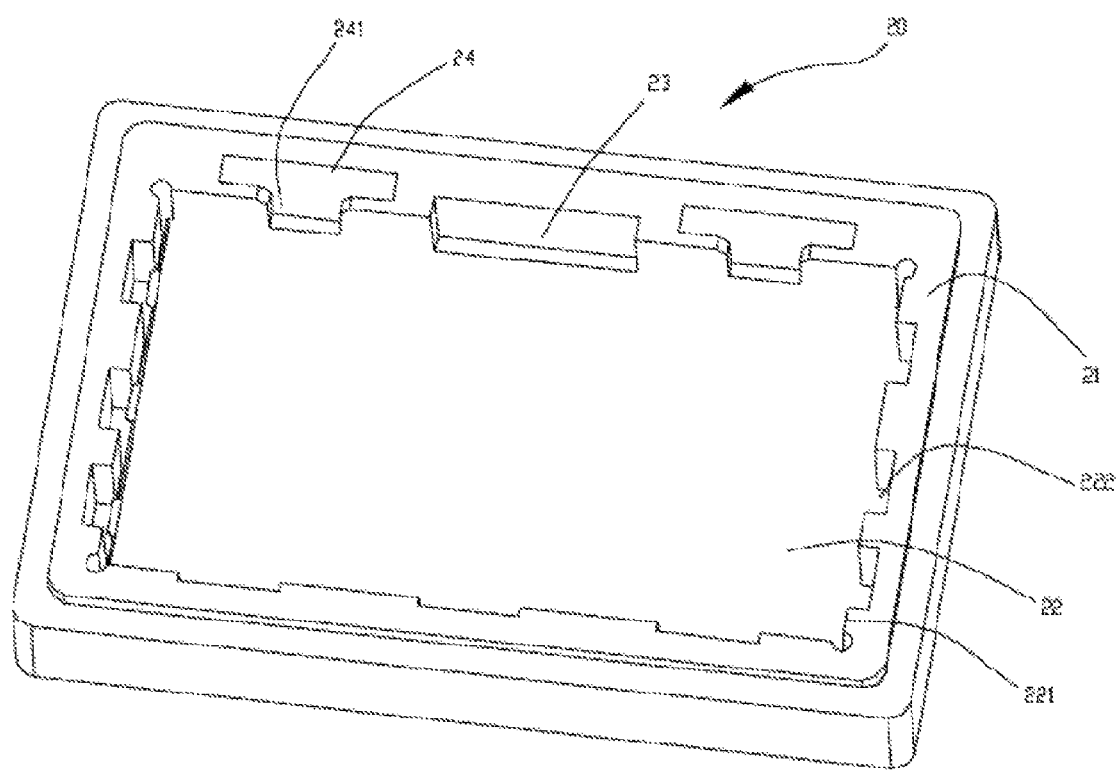
FIG. 3 is a perspective diagram showing a liquid crystal panel packaging assembly according to an embodiment of the present invention.
Figure 4:
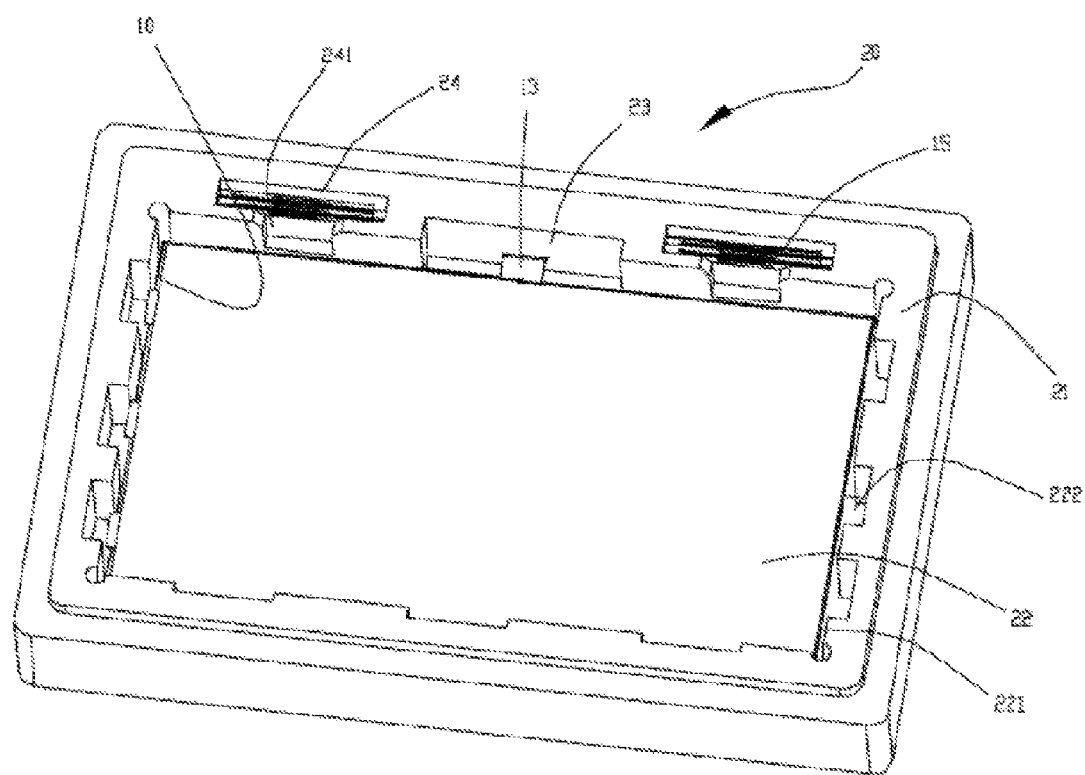
FIG. 4 is a perspective diagram showing the liquid crystal panel packaging assembly of FIG. 3 stored with the liquid crystal panel assembly of FIG. 1.

Please refer to FIG. 3 and FIG. 4. A liquid crystal panel packaging assembly according to an embodiment of the present invention contains a liquid crystal panel assembly and a support tray 20. The support tray 20 contains a first indentation 22 for receiving the liquid crystal panel 10, a second indentation 23 for receiving the wiring board 13, and at least a socket 24. The second indentation 23 is at a side and is connected to the first indentation 22. The socket 24 is located at a lateral side of the second indentation 23. The circuit board 15 is plugged into the socket 24.

In the present embodiment, the support tray 20 has a rectangular shape and is made of a plastic material or cardboard. The support tray has a major face 21 where the first indentation 22 has a rectangular shape indented from the major face 21's center. Multiple liquid crystal panels 10 are stacked and accommodated in the first indentation 22. The first indentation 22's side walls are roughened so as to hold the liquid crystal panels 10 reliably. A side wall 221 of the first indentation 22 is configured with at least a recess 222 so as to facilitate the access and reach of the liquid crystal panels 10 inside the first indentation 22. The second indentation 22 is located in the middle to a side of the first indentation 22 on the major face 21. The wiring boards 13 are received in the second indentation 23.

In the present embodiment, there are two sockets 24 located to the lateral sides of the second indentation 23 on the major face 21. Each socket 24 is connected to the first indentation 22 with a gap 241. Multiple circuit boards 15 are plugged vertically into the sockets 24, and the gaps 241 provides convenient reach and access to the circuit boards 15.

In using the liquid crystal panel packaging assembly, the liquid crystal panels 10, the wiring boards 13, and the circuit boards 15 are stored separately. As such, the problem of warping and bending the wiring boards when multiple liquid crystal panel assemblies are stacked is prevented, preserving the safety and therefor the quality of the liquid crystal panel assemblies during their transportation.

Above are embodiments of the present invention, which does not limit the scope of the present invention. Any modifications, equivalent replacements or improvements within the spirit and principles of the embodiment described above should be covered by the protected scope of the invention.

What is claimed is:
1. A liquid crystal panel packaging assembly, comprising:
a liquid crystal panel assembly; and
a support tray;
wherein the liquid crystal panel assembly comprises a liquid crystal panel, a wiring board, and a circuit board;
the wiring board has a first end electrically connected to a side of the liquid crystal panel;
a second end of the wiring board is configured with a first connection element;
correspondingly, the circuit board has a second connection element for connection with the first connection element so that the circuit board is electrically connected to the wiring board;
the support tray comprises a first indentation indented from a major face of the support tray for receiving the liquid crystal panel, a second indentation for receiving the wiring board, and at least a socket for vertically plugging the circuit board;
the second indentation is located in the middle to a side of the first indentation on the major face and is connected to the first indentation;

the socket is located at a lateral side of the second indentation on the major face and is connected to the first indentation via a gap.

2. The liquid crystal panel packaging assembly according to claim 1, wherein the first indentation's side walls are roughened; and at least a side wall of the first indentation is configured with at least a recess.

3. The liquid crystal panel packaging assembly according to claim 1, wherein the first connection element has a plug with conductive terminals whereas the second connection element has a matched socket; or the second connection element has a plug with conductive terminals whereas the first connection element has a matched socket.

* * * * *